United States Patent
Wu et al.

(10) Patent No.: US 6,965,432 B2
(45) Date of Patent: Nov. 15, 2005

(54) NON-INVASIVE WAFER TRANSFER POSITION DIAGNOSIS AND CALIBRATION

(75) Inventors: Yu-Yi Wu, Yungkang (TW); Kun-Ei Chen, Tainan (TW); San-Ching Lin, Pingtung (TW)

(73) Assignee: Taiwan Semiconductor Manufacturing Co., Ltd., Hsin Chu (TW)

( * ) Notice: Subject to any disclaimer, the term of this patent is extended or adjusted under 35 U.S.C. 154(b) by 305 days.

(21) Appl. No.: 10/165,006

(22) Filed: Jun. 7, 2002

(65) Prior Publication Data

US 2003/0227624 A1 Dec. 11, 2003

(51) Int. Cl.$^7$ .............................................. G01B 11/00
(52) U.S. Cl. .................................... 356/400; 356/620
(58) Field of Search ............................... 356/400, 401, 356/620; 438/14; 73/865.9, 865.8

(56) References Cited

U.S. PATENT DOCUMENTS

| | | | |
|---|---|---|---|
| 5,955,654 A * | 9/1999 | Stover et al. ................. | 73/1.89 |
| 6,420,892 B1 * | 7/2002 | Krivy et al. ................. | 324/758 |
| 6,559,456 B1 * | 5/2003 | Muraki ..................... | 250/491.1 |
| 6,684,172 B1 * | 1/2004 | Subramanian et al. ...... | 702/105 |
| 2002/0018217 A1 * | 2/2002 | Weber-Grabau et al. .... | 356/601 |

* cited by examiner

*Primary Examiner*—Layla G. Lauchman
(74) *Attorney, Agent, or Firm*—Randy W. Tung

(57) ABSTRACT

An apparatus and method for detecting mispositioned wafers attributable to transfer shift of the wafer are disclosed. A calibration wafer has a target region comprising a pattern of optically distinguishable features from which is determined the position of the calibration wafer within the chamber subsequent to its transfer therein. Preferably, the features comprise a pattern of colors that can be detected by spectroscopy. A preferred form and manner of providing such color features is by way of dielectric thin film filters.

19 Claims, 5 Drawing Sheets

| REGION | REFLECTED SPECTRUM CWL (nm) | POSITION (mm) | |
|---|---|---|---|
| | | X | Y |
| 1 | 870 | -1 | 1 |
| 2 | 850 | 0 | 1 |
| 3 | 830 | 1 | 1 |
| 4 | 810 | 1 | 0 |
| 5 | 790 | -0.4 | 0.2 |
| 6 | 770 | -0.4 | 0.4 |
| 7 | 750 | -0.2 | 0.4 |
| 8 | 730 | 0 | 0.4 |
| 9 | 710 | 0.2 | 0.4 |
| 10 | 690 | 0.4 | 0.4 |
| 11 | 670 | 0.4 | 0.2 |
| 12 | 650 | 0.4 | 0 |
| 13 | 630 | -0.2 | 0.2 |
| 14 | 610 | 0.2 | 0.2 |
| 15 | 590 | 0.2 | 0 |
| 16 | 570 | 0 | 0.2 |
| 17 | 550 | 0 | 0 |
| 18 | 530 | 0 | -0.2 |
| 19 | 510 | -0.2 | 0 |
| 20 | 490 | 0.2 | -0.2 |
| 21 | 470 | -0.2 | -0.2 |
| 22 | 450 | -0.4 | 0 |
| 23 | 430 | -0.4 | -0.2 |
| 24 | 410 | -0.4 | -0.4 |
| 25 | 390 | -0.2 | -0.4 |
| 26 | 370 | 0 | -0.4 |
| 27 | 350 | 0.2 | -0.4 |
| 28 | 330 | 0.4 | -0.4 |
| 29 | 310 | 0.4 | -0.2 |
| 30 | 290 | -1 | 0 |
| 31 | 270 | -1 | -1 |
| 32 | 250 | 0 | -1 |
| 33 | 230 | 1 | -1 |

*Figure 4*

NON-INVASIVE WAFER TRANSFER POSITION DIAGNOSIS AND CALIBRATION

TECHNICAL FIELD

The present invention is generally related to microchip fabrication. More particularly, the invention relates to the diagnosis and calibration of wafer transfer positioning.

BACKGROUND OF THE INVENTION

In microchip fabrication, processing chambers are used in accomplishing various fabrication steps performed on a wafer. For example, among the numerous varieties of steps are the non-exhaustive examples of annealing, cleaning, chemical vapor deposition, etching, oxidation, and nitridation.

Chambers generally comprise a substantially planar and horizontal pedestal upon which the wafer rests during the processing within the chamber. The pedestal may also be known as a platen, stage or susceptor. A lift mechanism comprising pins which breach the pedestal from underneath provides a controlled disengagement from, and engagement of the wafer to, the pedestal surface. Wafers are transferred into and out of the chamber, and onto and off of the lift mechanism pins, by way of a robotic mechanism including a robot blade or fork at the end of a robotic arm.

Retention of the wafer to the pedestal while in the chamber is referred to as chucking. Chucking may be accomplished by vacuum or mechanical means. Alternatively, retention of the wafer to the pedestal while in the chamber may be accomplished electrostatically by an electrostatic chuck.

Wafer placement or positioning in the chamber is a critical process parameter. Wafer position affects many other process parameters and steps. For example, mispositioned wafers may be subject to much lower yields due to edge effects, for example, in a sputtering process. Wafer mispositioning in one chamber may be perpetuated in subsequent chambers where a series of chambers are loaded by a common robotic arm since a wafer that is transferred to a robot blade from a chamber in which the wafer is mispositioned is likely to be mispositioned with respect to the blade. Wafer backside helium flow is another process parameter that can be adversely affected by wafer mispositioning. Backside helium flow that is too high is known to cause over-etching. Transfer shift is a main cause of mispositioned wafers. An out of calibration robotic transfer can result in a mispositioned wafer. Recalibration of wafer transfer has conventionally required opening the chamber to check wafer position and performing transfer calibration. Such chamber violation requires performance of a variety of operations prior to releasing the apparatus for production use. Such operations include venting of the chamber, removal of the chamber lid, gas distribution plate and all process kits. A wet cleaning of the chamber, lid and gas distribution plate as well as other ancillary maintenance operations also need to be performed. This maintenance can take significant time and manpower resources. Eight to twelve hours of apparatus down time is common. It is, however, generally desirable to avoid such processes.

SUMMARY OF THE INVENTION

Therefore, it is one object of the present invention to provide a non-invasive method of diagnosing wafer transfer position in a process chamber.

It is a further object of the present invention to provide a non-invasive method of calibrating wafer transfer position in a process chamber.

These objects and advantages of the present invention are realized in a wafer position calibration apparatus for a process chamber that includes a calibration wafer placed within the process chamber wherein the calibration wafer has features thereon having known orientations to the calibration wafer. The wafer position calibration apparatus further includes a detector effective to optically recognize such features and determine therefrom the position of the calibration wafer within the process chamber.

BRIEF DESCRIPTION OF THE DRAWINGS

The present invention will now be described, by way of example, with reference to the accompanying drawings, in which:

FIG. 4 is a table relating the various regions within the preferred calibration target region of FIG. 3;

DESCRIPTION OF THE PREFERRED EMBODIMENT

According to the present invention, wafer transfer calibration in a process chamber is accomplished in a non-invasive manner. Unless independent necessity dictates that the chamber needs to be opened, the present invention provides for optical inspection of a calibration wafer transfer within the chamber and corrective calibration of the wafer transfer apparatus in accordance with the results of such inspection. Thus, venting of the chamber, removal of the chamber lid, gas distribution plate and process kit is avoided. Similarly, unnecessary wet cleaning of the chamber, lid and gas distribution plate as well as other ancillary maintenance required when the plasma chamber is opened and compromised are avoided.

Figure 1A:
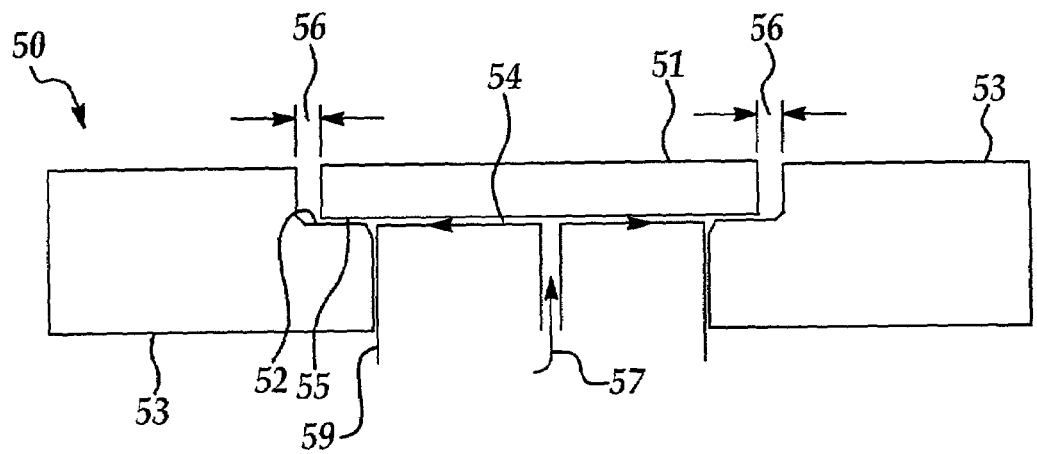
FIGS. 1A and 1B illustrate various features in section of an exemplary process chamber and properly positioned and mispositioned wafers, respectively.
Figure 1B:
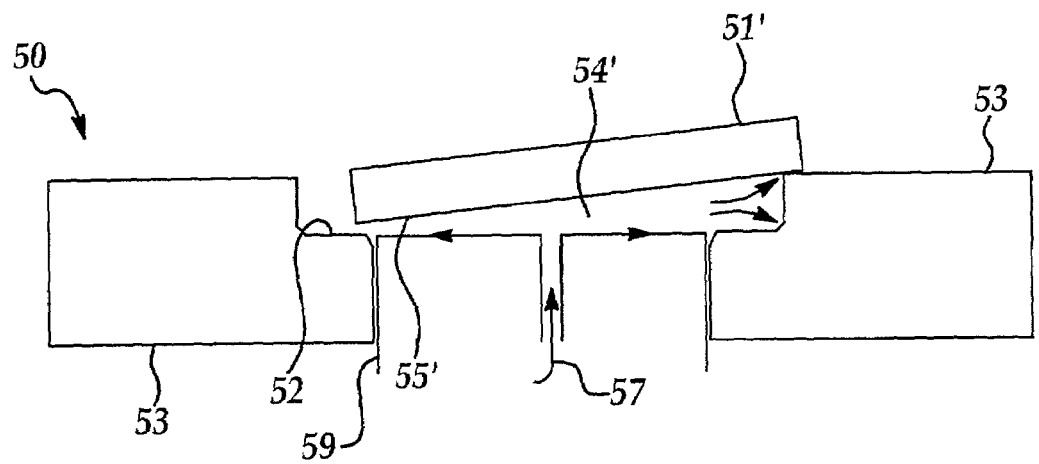

Referring to FIGS. 1A and 1B, portions of an exemplary process chamber 50 is illustrated. Electrostatic chuck 59 is located central to and is surrounded by an edge ring 53. Properly positioned (FIG. 1A) process wafer 51 is supported at its backside 55 about its periphery by an inner edge recess or flange 52 of edge ring 53. A substantially uniform gap 56, typically about 1 mm, is between the outer edge of the wafer 51 and the edge ring 53. Backside gap 54 is provided between wafer backside 55 and electrostatic chuck 59.

Backside helium flow as may commonly be practiced in various etching processes is illustrated by the various arrows 57 through electrostatic chuck and backside gap 54. Backside gap 54 is conventionally established by a plurality of flow channels on the upper surface of electrostatic chuck 59. More than one flow channel through the electrostatic chuck 59 is also conventional. In contradistinction, an improperly positioned (FIG. 1B) process wafer 51' is shown impinging upon the upper surface of edge ring 53 on one side and upon the flange 52 of edge ring 53 at the opposite side.

Figure 2:
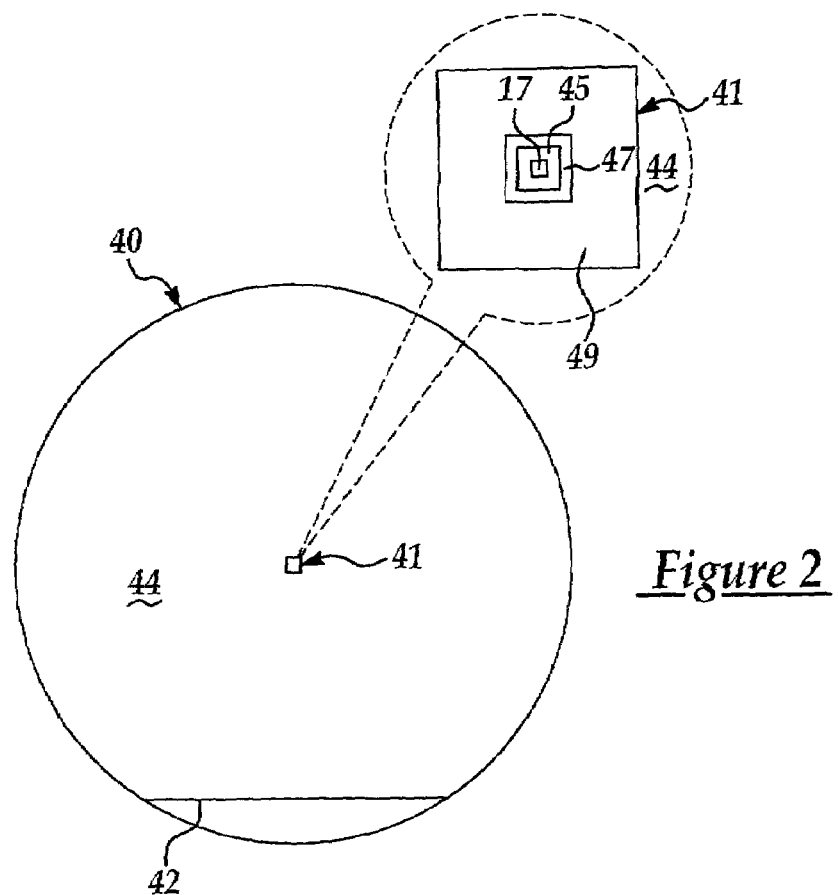
FIG. 2 is a plan view schematic of a calibration wafer with a detail callout of an exemplary calibration target region in accordance with the present invention.

A calibration wafer in accordance with the present invention is illustrated in FIG. 2. The wafer 40 has an upper surface and is generally circular and may include one or more flats 42 as an orientation reference. Notches, as are conventionally used in fabrication of 300 mm wafers to indicate crystal orientation, may alternately be found on a calibration wafer as an orientation reference. Located in the center of the calibration wafer 40 is target region 41. Target region 41 includes certain optically recognizable features which allow for the determination of the calibration wafer's position within the chamber. The broken line callout of FIG. 2 provides a detailed view of an embodiment of certain optically recognizable features of target region 41. At the geometric center of the calibration wafer circle, whether the wafer actually contains orientation features such as those described, is a centermost region 17 of distinguishable regions within target 41. Concentrically surrounding the centermost region 17 are progressively larger outer regions independently designated 45, 47 and 49 or combinationally designated as groupings of sub-regions 45, 47 or 45, 47, 49. Region as used herein may refer interchangeably to regions or sub-regions. It is preferred, though not required, that the target be associated with the center of the wafer circle. It is also desirable that such features and hence each of the regions be distinguishable one from the next by the optical apparatus later described.

One manner of providing features that are distinguishable one from the next is to provide regions that have different heights relative to the calibration wafer upper surface 44. Height differential as between regions may be detected, for example, by use of an interferometer. Another, and preferred manner of providing features that are distinguishable one from the next is to provide regions that have different color or other reflective characteristics. Such differentials as between regions may be detected, for example, by use of a spectrometer, interferometer, or combinational apparatus.

Figure 7:
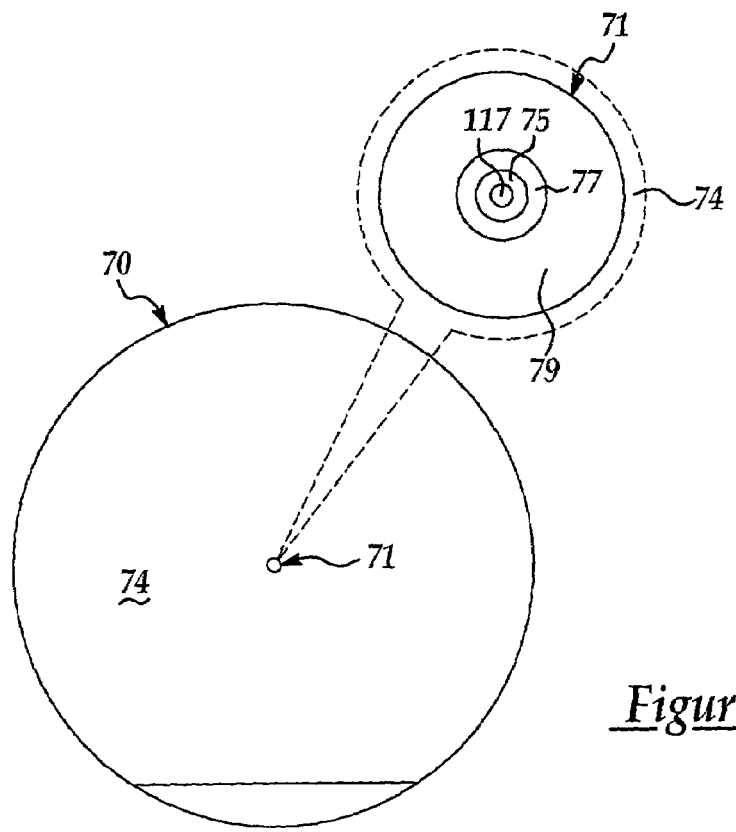
FIG. 7 is a plan view schematic of a calibration wafer with a detail callout of an alternate calibration target region in accordance with the present invention; and, FIG. 8 is a detailed plan view schematic of an alternate calibration wafer target region in accordance with the present invention.

In the present exemplary target region 41 of FIG. 2, the centermost region 17 is substantially square and the perimetrically surrounding regions 45, 47, and 49 are similarly shaped having respective square outer peripheral edges. A variation of the target region illustrated in FIG. 2 is illustrated in FIG. 7 wherein calibration wafer 70 similarly has an upper surface and a target region 71. Target region 71 in FIG. 7, however, is substantially circular with a circular centermost region 117 and progressively larger outer regions independently designated 75 or combinationally designated as groupings of sub-regions 75, 77 or 75, 77, 79. The type of target regions described with respect to FIGS. 2 and 7 are perhaps best suited for optical apparatus capable of being indexed or moved in a controlled and known fashion. For example, an optical apparatus having a default or zeroed focal or illumination position relative to the center of a properly positioned calibration wafer within the chamber may focus or illuminate an outer region of a mispositioned calibration wafer. However, such a target region would provide only information related to distance that the calibration wafer is off center from a proper position and no other coordinate-type information indicative of direction, quadrant, etc. of the calibration wafer's mispositioning. This is generally true even when the orientation of the wafer is known by virtue of the orientation notch or flat. It might be beneficial with such target area to be able to index the optical apparatus and seek the centermost region whereby the offset from the zeroed focal or illumination position indicates the magnitude and direction of the mispositioning of the calibration wafer, which offset data may be correctively utilized in calibration of the transfer robot.

Figure 3:
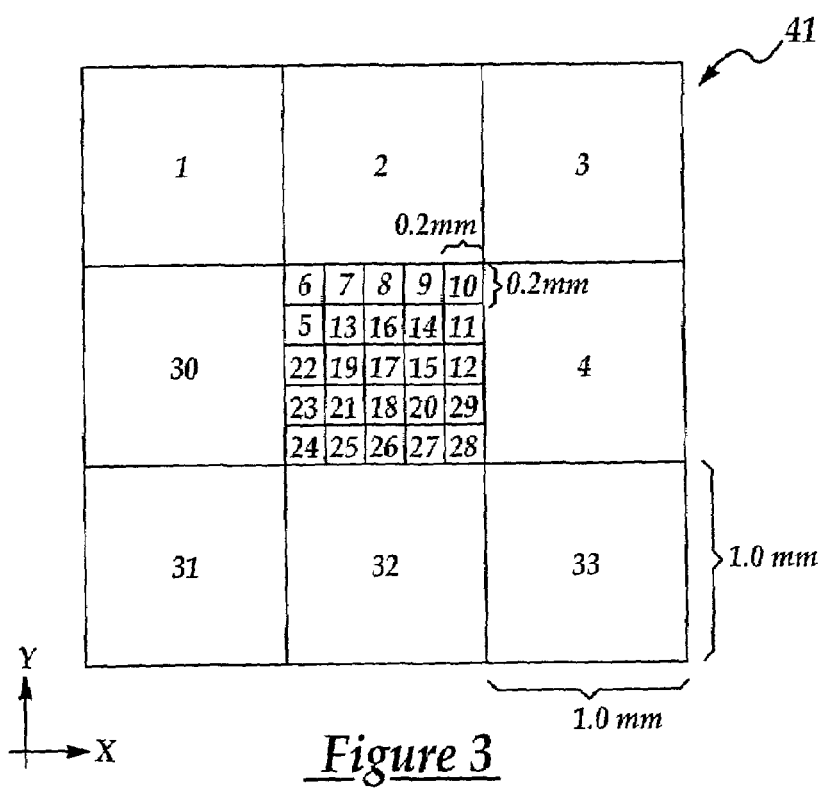
FIG. 3 is a detailed plan view schematic of a preferred calibration wafer target region in accordance with the present invention.

Alternatively, and preferably, a target region on a calibration wafer will have sub-regions that have known distance and direction from the centermost region. An exemplary target region is illustrated in FIG. 3 and shares the same reference numeral 41 as the target area illustrated in FIG. 2. In fact, the target area of FIG. 3 is a more detailed variation of the target consistent with the basic configuration illustrated in FIG. 2. In FIG. 2, centermost region 17 is immediately surrounded by region 45. This region 45 comprises sub-regions 13, 14, 15, 16, 18, 19, 20, 21 of FIG. 3. The next progressively larger concentric region 47 of FIG. 2 comprises sub-regions 5, 6, 7, 8, 9, 10, 11, 12, 22, 23, 24, 25, 26, 27, 28, 29. Finally, the outermost region 49 of FIG. 2 comprises sub-regions 1, 2, 3, 4, 30, 31, 32, 33. The regions in this embodiment are square with the outermost regions being larger than the regions surrounded thereby. The larger, outermost regions and the region central thereto made up of the smaller, inner sub-regions generally form a checkerboard pattern or regular two-dimensional matrix. The smaller, inner regions similarly form a checkerboard pattern providing for a finer resolution of positional information. The larger outer regions are 1.0 mm square whereas the smaller inner regions are 0.2 mm square. The absolute sizes of regions and sub-regions actually employed will depend upon the resolution desired for a particular application.

Figure 8:
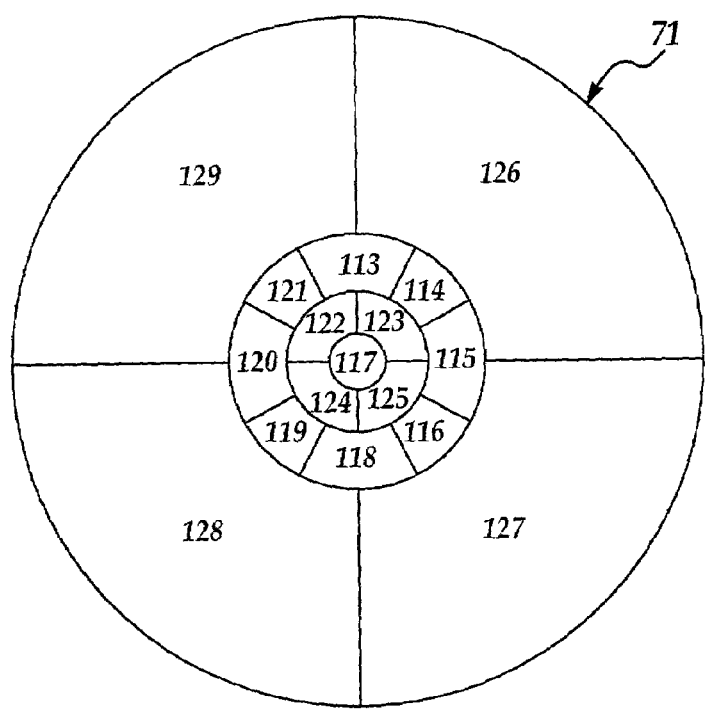

FIG. 8 illustrates a circular implementation of a target area sharing the same reference numeral 71 as the target area illustrated in FIG. 7. In fact, the target area of FIG. 8 is a more detailed variation of the target consistent with the basic configuration illustrated in FIG. 7. In FIG. 7, centermost region 117 is immediately surrounded by region 75. This region 75 comprises sub-regions 122, 123, 124, 125. The next progressively larger concentric region 77 of FIG. 7 comprises sub-regions 113, 114, 115, 116, 118, 119, 120, 121. Finally, the outermost region 79 of FIG. 2 comprises sub-regions 126, 127, 128, 129.

A regular, two-dimensional checkerboard pattern for a target region as described in FIG. 3 provides a convenient correspondence to a Cartesian coordinate system as suggested in the X-Y axes illustrated adjacent to the target region 41 in FIG. 3. In the present embodiment, the origin (0,0), or zero position, corresponds to the centermost sub-region 17. The sub-region 17 corresponds to the center of the calibration wafer. Preferably, the orientation of the coordinate system and the target region is known relative to any orientation reference flat or notch.

In a preferred embodiment of optically recognizable features making up the target region, each of the regions or sub-regions comprises a color or other reflective property that is distinguishable from such property of the remaining regions or sub-regions. Preferably, the regions comprise dielectric thin film filters. More particularly, the regions may be referred to as dichroic mirrors if the back surfaces thereof are totally reflective. Otherwise, such filters that pass certain wavelengths while reflecting others may be referred to as bandpass interference filters. Both varieties of such thin film filters may be referred to herein generally as filter. Both types function in a substantially equivalent fashion wherein thin, transparent layers placed between semireflective coatings produce multiple reflections and constructive and destructive interference in accordance with well understood principles. Such target areas are readily understood and manufacturable by any semiconductor fabrication enterprise utilizing conventional processes including evaporative deposition of layers of such high refraction material such as Titanium Oxides, for example $TiO_2$, $TiO_5$, etc., and low refraction material such as Silicon Oxides, for example $SiO_2$.

With reference now to FIG. 4, an exemplary central wavelength spectral distribution for target region 41 having filters corresponding to the regions as exemplified in FIG. 3 is illustrated. The leftmost column corresponds to the similarly numbered region of target area 41. The adjacent column sets forth the reflected spectrum center wavelength of the region in diced in the same row. It is here noted that each of the regions having a reflected spectrum central wavelength is also characterized by a certain band width generally understood to be defined with respect to the wavelengths to either side of the central wavelength whereat the signal intensity is attenuated by a predetermined amount relative to the central wavelength, for example −3 dB. Definition of such bandwidth is only important in as much as adjacent regions need to be distinguishable one from another. The final two rightmost columns in the figure correspond to the respective X and Y coordinates of the center of each region of the target region 41. For example, the centermost region 17 can be seen to have a reflected spectrum center wavelength of 550 nm and X-Y coordinates of (0,0) which corresponds to the center of the calibration wafer whereas region 1 can be seen to have a reflected spectrum center wavelength of 870 nm and X-Y coordinates of (−1,1) which corresponds to the center of region 1 which lies in the second quadrant of the Cartesian coordinate system and of the calibration wafer relative to its center point being coexistent with origin of the coordinate system.

Figure 5:
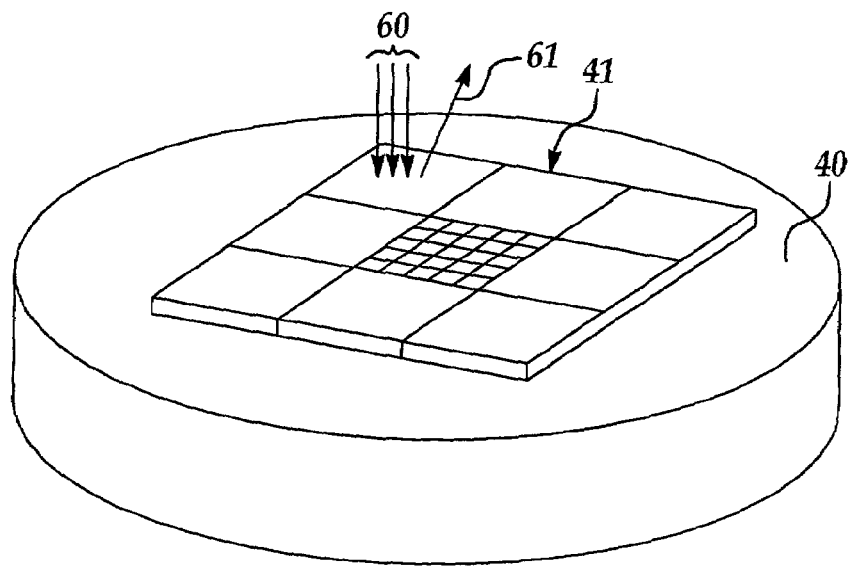
FIG. 5 is a perspective illustration of the preferred calibration target region of FIG. 3 illustrative of incident and reflective light utilized in spectroscopic detection in accordance with the present invention.

FIG. 5 illustrates conceptually a filter target region 41 in accordance with the prior description. The target region is shown on the partially illustrated calibration wafer 40. Incident light 60 upon the target area 41 results in reflected light 61. Incident light 60 has a spectral content inclusive of the reflected spectrum central wavelengths selected for the target region. In the present example, the incident light would have a spectral content spanning substantially 230 nm to 870 nm. Such an incident light presently may be referred to a white light or broadband light. The reflected light 61 of course is selectively limited by operation of the filter in each of the particular regions of the target region.

Figure 6:
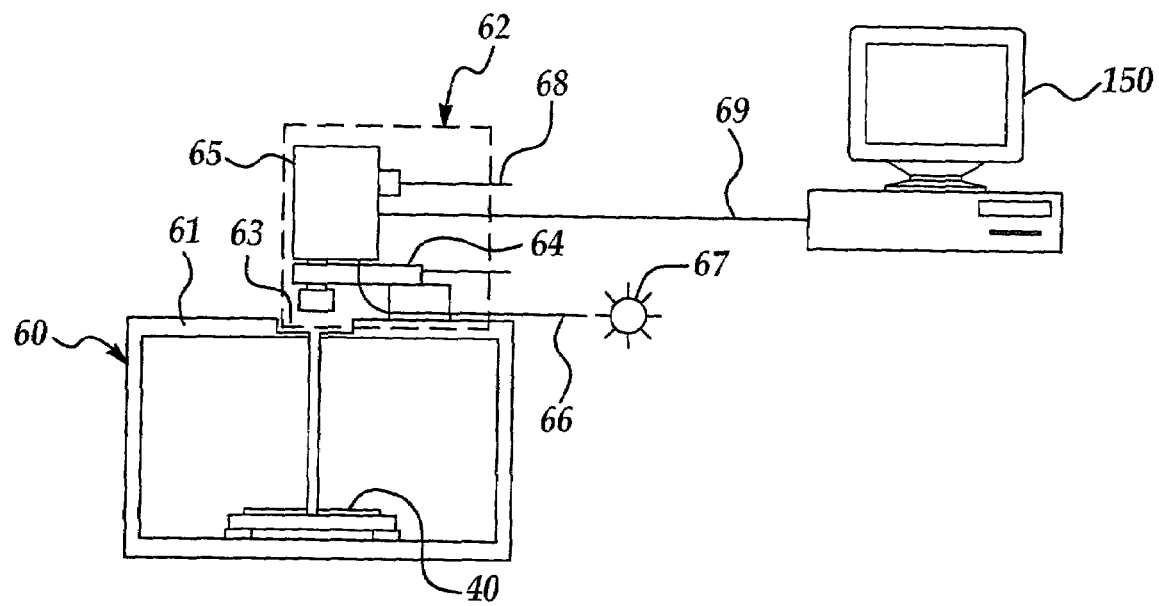
FIG. 6 is a schematic representation of an optical detection apparatus in accordance with the present invention.

With reference now to FIG. 6, an exemplary apparatus including optical apparatus 62 and chamber 60 for practicing the present invention is illustrated. Chamber 60 includes chamber lid or dome 61 including window 63 providing optical access to the chamber. The chamber includes sidewalls and a slot therethrough for providing access to a robotic blade carried by an articulated robotic arm as well known to those skilled in the art. A calibration wafer as described is inserted into the chamber robotically with a known orientation to the transfer blade or fork by virtue of the orientation feature on the calibration wafer and conventional prealignment handling. The robotic blade during load and unload sequences is commanded by a controller to reach through the slot into the chamber.

Fiber optic cable 66 is used to connect the broadband light source 67 to the optical apparatus 62. Optical apparatus 62 in turn provides the incident broadband light within the chamber and onto the calibration wafer 40. An exemplary broadband light source is a conventional Xenon lamp producing strong spectral content ranging from about 200 nm to about 900 nm. Interferometric camera 65 comprising CCD sensor or photodiode array is mounted on a motorized controllable X-Y stage 64. A video signal is output on line 68 which may be connected to a monitor (not illustrated). Interferometric signal is output over line 69 to computer 150. Computer 150 may be dedicated computer equipment for processing optical apparatus information or be a process module computer for carrying out a variety of process related data acquisition and control functions as familiar to those skilled in the art.

In one implementation, a microspot of white light is incident upon the calibration wafer. The microspot is generally producible having dimensions at least an order of magnitude less than the smallest regions on the exemplary target region or about 20 to about 120 microns depending upon the distance from the optical apparatus 62 and calibration wafer. The camera 62 performs a spectroscopic reflectometry measurement of the illuminated region of the target area. The measurement thus taken can be utilized with the known pattern as exemplified by the data in the matrix of FIG. 4 to determine the position of the centermost region of the target region and hence the position of the calibration wafer. Alternatively, the reflected light may be collected and passed through another fiber optic cable to a remote spectograph unit such as a single board spectrometer where the spectral content is determined and the region illuminated determined therefrom in relation to the known pattern as exemplified by the data in the matrix of FIG. 4.

In another implementation, white light is incident upon the calibration wafer in a larger area to cover an area to be viewed by the camera. A camera calibration measurement is taken with an empty chamber and at least one feature that can relate the point in the chamber on the chuck that corresponds to the center of a properly positioned wafer. Through use of color pattern recognition software, the position of the calibration wafer may be determined in relation to the chamber.

Pattern recognition can also be implemented absent any color detection to determine the position of a calibration wafer in the chamber similar to the immediately previously described implementation using color pattern recognition. Of course, one skilled in the art will recognize that the target area pattern must uniquely define the calibration wafer by geometric features independent of any color differentiating features.

Once the position of the calibration wafer has been determined, the data may be utilized in an automated or manual fashion to recalibrate the robotic transfer by controller adjustments. Mechanical adjustments may also be made to the transfer apparatus in recalibrating the robotic transfer.

The invention has been described with respect to certain preferred embodiments to be taken by way of example and not by way of limitation. Certain alternative implementations and modifications may be apparent to one exercising ordinary skill in the art. Therefore, the scope of invention as disclosed herein is to be limited only with respect to the appended claims.

What is claimed is:

1. Wafer position calibration apparatus for a process chamber comprising:
    a calibration wafer placed within the process chamber, said calibration wafer including features thereon having known orientations to the calibration wafer, wherein said features have a plurality of regions each associated with a reflected spectrum center wavelength; and, a detector effective to optically recognize said features and determine therefrom the position of the calibration wafer within the process chamber, wherein each of said reflected spectrum center wavelength is further associated with a respective bandwidth.

2. The wafer position calibration apparatus as claimed in claim 1 wherein said features comprise thin film interference filters.

3. The wafer position calibration apparatus as claimed in claim 1 wherein said features comprise regions characterized by respective reliefs.

4. The wafer position calibration apparatus as claimed in claim 2 wherein said features define a pattern that is centrally oriented with respect to the calibration wafer.

5. The wafer position calibration apparatus as claimed in claim 4 wherein said pattern comprises a checkerboard pattern.

6. The wafer position calibration apparatus as claimed in claim 4 wherein said pattern comprises a first region substantially centrally oriented with respect to the calibration wafer and a second region perimetrically bounding said first region.

7. The wafer position calibration apparatus as claimed in claim 2 wherein the detector discriminates reflective spectrum.

8. The wafer position calibration apparatus as claimed in claim 7 wherein the detector comprises a spectroscopic interferometer.

9. The wafer position calibration apparatus as claimed in claim 7 wherein the detector includes a broad band light source.

10. A calibration wafer for use in a process chamber, said chamber including a spectroscope and associated broad band light source, the calibration wafer comprising:

a first region within a larger target region, said first region substantially coincident with the center of said calibration wafer and characterized by a central wavelength spectral distribution; and a second region within said target region perimetrically bounding said first region.

11. The calibration wafer as claimed in claim 10 wherein the second region comprises a plurality of sub-regions, each of said plurality of subregions characterized by an associated respective reflected spectrum center wavelength.

12. The calibration wafer as claimed in claim 11 wherein the sub-regions are concentrically distributed.

13. The calibration wafer as claimed in claim 11 wherein the sub-regions are perimetrically distributed.

14. The calibration wafer as claimed in claim 11 wherein the sub-regions are further divided perimetrically.

15. The calibration wafer as claimed in claim 10 wherein said regions comprise dielectric thin film filters.

16. Method of wafer transfer calibration in a process chamber comprising the steps:

providing a calibration wafer characterized by features thereon having known orientations to the calibration wafer, wherein said features comprise different colors;

robotically transferring into the chamber a calibration wafer;

from outside of the chamber, optically detecting the features on the calibration wafer by use of spectroscopy;

relating the detected features to a predetermined mapping of said features relative to the calibration wafer; and, determining from said related features and mapping of said features the position of the calibration wafer in the chamber.

17. The method of wafer transfer calibration in a process chamber as claimed in claim 16 wherein the step of transferring comprises prealigning the calibration wafer.

18. The method of wafer transfer calibration in a process chamber as claimed in claim 16 wherein the features comprise different heights and optically detecting the features comprises interferometry.

19. The method of wafer transfer calibration in a process chamber as claimed in claim 16 further comprising the step of adjusting subsequent robotic transfers in accordance with the determined position of the calibration wafer.

* * * * *